(12) United States Patent
Hashimoto

(10) Patent No.: US 7,586,237 B2
(45) Date of Patent: Sep. 8, 2009

(54) PIEZOELECTRIC VIBRATOR, INTRINSIC FREQUENCY ADJUSTING METHOD OF PIEZOELECTRIC VIBRATOR, PIEZOELECTRIC ACTUATOR AND ELECTRONIC DEVICE

(75) Inventor: Yasuharu Hashimoto, Minami-Minowa (JP)

(73) Assignee: Seiko Corporation (JP)

( * ) Notice: Subject to any disclaimer, the term of this patent is extended or adjusted under 35 U.S.C. 154(b) by 163 days.

(21) Appl. No.: 11/705,377

(22) Filed: Feb. 12, 2007

(65) Prior Publication Data
US 2007/0188050 A1 Aug. 16, 2007

(30) Foreign Application Priority Data
Feb. 14, 2006 (JP) ............................. 2006-037223

(51) Int. Cl.
*H01L 41/053* (2006.01)
*H02N 2/12* (2006.01)
(52) U.S. Cl. ............................. 310/323.02; 310/323.01; 310/323.08
(58) Field of Classification Search ............ 310/323.01, 310/328, 348, 323.02, 323.08, 323.16
See application file for complete search history.

(56) References Cited

U.S. PATENT DOCUMENTS

| | | | |
|---|---|---|---|
| 5,073,739 A | 12/1991 | Iijima et al. | |
| 5,682,076 A | 10/1997 | Zumeris | |
| 6,064,140 A | * 5/2000 | Zumeris | 310/323.02 |
| 2004/0027032 A1 | * 2/2004 | Moteki et al. | 310/323.02 |
| 2005/0082950 A1 | * 4/2005 | Zakoji | 310/348 |

FOREIGN PATENT DOCUMENTS

| | | |
|---|---|---|
| EP | 0 951 078 | 10/1999 |
| EP | 1 617 490 | 1/2006 |
| EP | 1 691 427 | 8/2006 |
| JP | 3614009 B | 11/2004 |
| JP | 3721928 B | 9/2005 |

* cited by examiner

*Primary Examiner*—Quyen Leung
*Assistant Examiner*—Derek J Rosenau
(74) *Attorney, Agent, or Firm*—Harness, Dickey & Pierce, P.L.C.

(57) ABSTRACT

A piezoelectric vibrator includes: a flat plate piezoelectric element, the piezoelectric vibrator vibrating in a mixed mode of stretching vibration that generates a displacement in a first direction within a plane of the piezoelectric element and a bending vibration that generates a displacement in a second direction orthogonal to the first direction; a vibrating member provided with the piezoelectric element and vibrated by applying voltage on the piezoelectric element; a support member provided on the vibrating member to support the vibrating member in a vibratable manner the support member being provided on an outer edge of the vibrating member at a position adjacent to anti-node other than free end of the bending vibration, the support member including a first support section extending in a direction approximately orthogonal to the first direction and a second support section extending in a direction approximately orthogonal to the direction in which the first support section extends; and a fixing portion provided on the support member to be fixed on an object on which the piezoelectric vibrator is attached.

9 Claims, 9 Drawing Sheets

US 7,586,237 B2

PIEZOELECTRIC VIBRATOR, INTRINSIC FREQUENCY ADJUSTING METHOD OF PIEZOELECTRIC VIBRATOR, PIEZOELECTRIC ACTUATOR AND ELECTRONIC DEVICE

The entire disclosure of Japanese Patent Application No. 2006-37223, filed Feb. 14, 2006, is expressly incorporated by reference herein.

BACKGROUND

1. Technical Field

The present invention relates to a piezoelectric vibrator, intrinsic frequency adjusting method of a piezoelectric vibrator, a piezoelectric actuator and an electronic device 2. Related Art In view of excellent conversion efficiency from electric energy to mechanical energy and high responsivity of piezoelectric element, a piezoelectric actuator that drives an object by transmitting a vibration of a piezoelectric vibrator having a piezoelectric element has been recently developed.

Known piezoelectric vibrator used for the piezoelectric actuator is shaped in a rectangular or trapezoidal plate or stick, which is vibrated in mixed vibration mode of longitudinal primary vibration and bending secondary vibration. Predetermined frequency of alternate voltage is applied to the piezoelectric element to resonate the vibrator and an object such as a rotor is highly efficiently driven in tangential direction of ellipsoidal locus traced by a part of the vibrator.

Conventional support member for supporting the vibrator in a vibratable manner while being in contact with the rotor is a narrow section or a linear beam member provided on a lateral side of plate-shaped vibrator at a position near nodes of longitudinal vibration and bending vibration. Since the vibrator is supported at lateral side, the thickness of the piezoelectric actuator can be reduced (see, for instance, Document 1: Japanese Patent No. 3,614,009 (FIG. 1)).

As an alternative, narrow section and an L-shaped spring section for urging the vibrator toward the rotor are integrated to form a support (see, for instance, Document 2: Japanese Patent No. 3,721,928 (FIG. 2 etc.)).

As described above, conventional support member supports the vibrator at a position adjacent to vibration nodes where displacement per each vibration mode is minimized, thereby avoiding restriction on the vibration of the vibrator.

Intrinsic frequency (i.e. resonance frequency) of the piezoelectric vibrator is likely to be deviated in accordance with deviation of the properties of piezoelectric material, machining dimension of component and assembly error. In order for a part of the piezoelectric vibrator to assume an ellipsoidal movement, the intrinsic frequency of the longitudinal vibration and the bending vibration has to be adjusted to satisfy a predetermined relationship.

The above-mentioned support member is used for adjusting the intrinsic frequency, which is carried out by, for instance, cutting the support member. However, when a vibrator having mixed mode of vibration, i.e. longitudinal vibration and bending vibration is used, it is preferable to separately adjust the intrinsic frequency per each vibration mode considering efficiency in adjustment process.

However, since the bending vibration is a point-symmetric vibration around the center of gravity of the vibrator, which accompanies the moment in a displacement direction of the longitudinal vibration, the support member provided on the lateral side of the vibrator is bent in the longitudinal direction of the vibrator, thereby applying the moment on the support member. In other words, in addition to the displacement on account of the longitudinal vibration and the bending vibration, the moment is also applied on the support member. Accordingly, even when the support member does not have a narrow shape or a beam shape but has an L-shape, and can be cut at both ends, intrinsic frequency of longitudinal vibration and intrinsic frequency of bending vibration cannot be separately adjusted. Accordingly, it is extremely difficult to adjust the intrinsic frequency, where productivity and yield rate are deteriorated to result in high production cost.

SUMMARY

In view of the above deficiencies, an object of the invention is to provide a piezoelectric vibrator capable of easily adjusting intrinsic frequency, an intrinsic frequency adjusting method of a piezoelectric vibrator, a piezoelectric actuator and an electronic device.

A piezoelectric vibrator according to an aspect of the invention, includes: a flat plate piezoelectric element, the piezoelectric vibrator vibrating in a mixed mode of stretching vibration that generates a displacement in a first direction within a plane of the piezoelectric element and a bending vibration that generates a displacement in a second direction orthogonal to the first direction; a vibrating member provided with the piezoelectric element and vibrated by applying voltage on the piezoelectric element; a support member provided on the vibrating member to support the vibrating member in a vibratable manner; and a fixing portion provided on the support member to be fixed on an object on which the piezoelectric vibrator is attached, the support member being provided on an outer edge of the vibrating member at a position adjacent to anti-node other than free end of the bending vibration, the support member including a first support section extending in a direction approximately orthogonal to the first direction and a second support section extending in a direction approximately orthogonal to the direction in which the first support section extends.

Since the support member is provided adjacent to anti-node (other than free end) of bending vibration, the moment generated by the bending vibration, which is usually applied when the support member is disposed on an outer edge of the vibrating member, is hardly applied on the support member. Accordingly, it can be safely regarded that only the stretching displacement caused by the stretching vibration and bending displacement caused by the bending vibration are applied on the support member. The support member includes the first support section extending along a direction substantially perpendicular to the displacing direction of the stretching vibration and the second support section substantially orthogonal to the first support section, the deformation of the first support section absorbing most of the displacement of the stretching vibration and the deformation of the second support section absorbing most of the displacement of the bending vibration, so that the first and the second support sections support the vibrating member while separating the respective vibration modes of the stretching vibration and the bending vibration. Accordingly, adjustment of the dimension and shape of the first and the second support section allows independent adjustment of the intrinsic frequency of the stretching vibration and the intrinsic frequency of the bending vibration. The difference between the intrinsic frequency of the stretching vibration and the intrinsic frequency of the bending vibration can be adjusted in a desired value by adjusting at least one of the first and the second support sections.

In other words, since the intrinsic frequency of the piezoelectric vibrator having a plurality of vibration modes including the stretching vibration and the bending vibration can be easily and speedily adjusted in accordance with resonance point, productivity can be improved and manufacturing cost of the vibrator can be reduced. Further, deviation in the intrinsic frequency can be eliminated to achieve desired vibration characteristics.

Incidentally, the stretching vibration is not limited, which includes a longitudinal vibration excited on a vibrating member having longitudinal direction and respiratory vibration on a circular plate, square plate and the like.

Since the support member is provided at the position adjacent to the anti-node of the bending vibration other than the free end, both ends of the vibrating member in the expanding/contracting displacement direction, i.e. anti-node of both of the stretching vibration and bending vibration, can be set free, so that great amplitude can be obtained.

By adjusting the respective intrinsic frequencies of the stretching vibration and bending vibration by the first and the second support sections, amplitude of both of the stretching vibration and bending vibration can be secured and ellipsoidal movement of a part of the vibrator can be achieved. Specifically, when the difference between the intrinsic frequencies of the stretching vibration and bending vibration is too great, the displacement of one of the stretching vibration and the bending vibration dominates the other and the ellipsoidal movement cannot be achieved. On the other hand, when the difference between the intrinsic frequencies of the stretching vibration and bending vibration is too small, because of narrow bandwidth of the drive frequency, the frequency control becomes difficult and the movement of the vibrator is likely to be unstable. Since the difference between intrinsic frequencies of the stretching vibration and bending vibration is properly adjusted, regular locus of ellipsoidal movement can be obtained for each piezoelectric vibrator. Accordingly, a piezoelectric vibrator satisfying a predetermined vibration characteristics can be stably provided.

Incidentally, since the support member is provided on the outer edge of the vibrating member, the thickness of the piezoelectric vibrator can be reduced and adjustment of vibration characteristics can be facilitated as compared with an arrangement where a pin-shaped support member penetrates approximate center of the vibrating member.

In the piezoelectric vibrator according to the above aspect of the invention, the first support section may preferably include a pair of first support sections extending substantially in parallel from positions adjacent to different anti-nodes of a plurality of anti-nodes of the bending vibration, and the second support section may preferably connect the pair of first support sections.

According to the above arrangement, since the pair of first support sections extend substantially in parallel from two positions adjacent to the anti-node of the bending vibration and the pair of first support sections are connected by the second support section, the vibrating member can be stably supported. Accordingly, damage on the vibrating member can be avoided even when excessive displacement or disturbance is applied.

In the piezoelectric vibrator according to the above aspect of the invention, the fixing portion may preferably be fixed on the object along a nodal line of the stretching vibration of the vibrating member.

According to the above arrangement, since the fixing portion provided on the support member and fixed on the object is disposed along the nodal line of the stretching vibration, damping of the stretching vibration caused by the presence of the fixing portion can be restrained to the minimum. Accordingly, the displacement of the vibrating member can be further increased and the energy required for exciting the vibration can be reduced, thereby enhancing drive efficiency In the piezoelectric vibrator according to the above aspect of the invention, the first support section may preferably include portions having different rigidity, the portions including a first rigid portion adjacent to the vibrating member and a second rigid portion having less rigidity than the first rigid portion.

The width of the support member is determined in view both of mechanical strength and loss of vibration energy. When the rigidity of the support section is lowered giving priority to prevention of dissipation of the vibration energy toward the fixing portion, abnormal vibration is likely to be caused, where excessive displacement occurs on account of deflection and eccentricity of the rotor to which the vibration of the piezoelectric vibrator is transmitted and change in condition of abutment surface to which the vibrating member is abutted, which may result in damage of the vibrator.

According to the above arrangement, since the first rigid portion having greater rigidity is provided on a side of the first support section adjacent to the vibrating member, damage of the vibrating member including the piezoelectric element and the support member on account of abnormal vibration caused by external force from the rotor and the like and disturbance caused by a shock can be prevented. On the other hand, since the second rigid portion having less rigidity is provided on a side of the fixing portion of the first support section, the vibration energy of the vibrating member dissipating into the fixing portion through the support member can be reduced, thereby improving drive efficiency.

In other words, conventional arrangement requires lowering the rigidity of the entire support section in order to prevent dissipation of the vibration energy, which may result in abnormal vibration and damage. However, since the first support section is provided with the first and the second rigid portions with different rigidity, sufficient strength capable of enduring disturbance such as the abnormal vibration can be secured and drive efficiency can be improved by reducing loss of vibration energy.

In order to provide the first rigid portion and the second rigid portion on the first support section with a simple arrangement, the width of the first support section is thickened on one end (vibrating member side) and is thinned on the other end. Since the stress caused at the connection of the vibrating member and the first support section by the external force of the vibrating member is distributed in proportion to the width of the first rigid portion, concentration of the stress can be avoided by thickening the first rigid portion, thereby further lowering the likelihood of damage.

When the first support section is used to adjust the intrinsic frequency of the stretching vibration, it is preferable that the second rigid portion is cut to adjust the dimension and shape thereof. Since the stress applied by normal vibration and the like is greater on the side of the first rigid portion located adjacent to the vibrating member, the damage can be more securely prevented by maintaining the strength without changing the dimension, shape etc. of the first rigid portion.

In the piezoelectric vibrator according to the above aspect of the invention, the second support section may preferably include portions having different rigidity, the portions including a first rigid portion adjacent to the fixing portion and a second rigid portion having less rigidity than the first rigid portion.

Since the stress on account of abnormal vibration etc. of the vibrating member is greater on the side of the fixing portion of the second support section, the first rigid portion of the second support section is located on the side of the fixing portion and the second rigid portion is located on the side of the first support section.

According to the above arrangement, since the second support section includes the first and the second rigid portions having different rigidity, strength sufficient for avoiding damage during disturbance such as abnormal vibration can be secured and reliability can be improved. Further, the drive efficiency can be improved by reducing loss of vibration energy.

The first and the second rigid portions can also be easily provided on the second support section by thickening the width of the second support section on one end (fixing portion side) and thinning on the other end. The thick first rigid portion allows distribution of stress and the damage can be further effectively prevented.

When the intrinsic frequency of bending vibration is to be adjusted using the second support section, it is preferable that the dimension, shape and the like of the second rigid portion is adjusted without changing the dimension, shape and the like of the first rigid portion, thereby maintaining strength of the first rigid portion.

In the piezoelectric vibrator according to the above aspect of the invention, it is preferable that the vibrating member is formed by laminating a reinforcing plate on the piezoelectric element and the first and the second support sections are integrally provided on the reinforcing plate.

According to the above arrangement, the reinforcing plate integrated with the first and the second support sections can be easily manufactured using press punching, and the piezoelectric element is laminated onto the reinforcing plate to reinforce the piezoelectric element while achieving lower production cost.

An intrinsic frequency adjusting method of a piezoelectric vibrator according to another aspect of the invention includes: providing the above-described piezoelectric vibrator and changing a dimension or a shape of at least one of the first support section and the second support section to adjust the intrinsic frequency of the piezoelectric vibrator.

The dimension and shape of the first and the second support sections can be adjusted by, for instance, end mill, ultrasonic cutter, and laser cutter.

According to the above arrangement, since the dimension and shape of the first and the second support sections that support the vibrating member in a manner separating the respective vibration modes of stretching vibration and bending vibration are adjusted, the intrinsic frequency of the stretching vibration and the intrinsic frequency of the bending frequency can be independently adjusted.

Accordingly, the intrinsic frequency of the piezoelectric vibrator having a mixed mode of vibration including the stretching vibration and the bending vibration can be easily and speedily adjusted, and deviation in the intrinsic frequency can be eliminated to achieve desired vibration characteristics.

In the intrinsic frequency adjusting method of piezoelectric vibrator according to the above aspect of the invention, it is preferable that, in adjusting the intrinsic frequency, difference between the intrinsic frequencies of the stretching vibration and intrinsic frequency of the bending vibration is adjusted by altering the dimension or the shape of one of the first support section and the second support section.

According to the above arrangement, the difference between the intrinsic frequencies of the stretching vibration and intrinsic frequency of the bending vibration is adjusted using one of the first and the second support sections, so that the intrinsic frequency can be easily and speedily adjusted. In other words, though minute deviation in intrinsic frequency result in notable deviation in vibration characteristics resulting in troublesome adjustment when the intrinsic frequency is adjusted in accordance with resonance point (e.g. when both of the intrinsic frequencies of the stretching vibration and the bending vibration are separately adjusted), such inconvenience can be eliminated.

A piezoelectric actuator according to still another aspect of the invention includes the above-described piezoelectric vibrator, in which a free end of the stretching vibration of the vibrating member in the displacing direction is abutted on a body to which the vibration of the piezoelectric vibrator is transmitted.

According to the above arrangement, since the above-described piezoelectric vibrator is provided, the same function and advantage as the above-described piezoelectric vibrator can be obtained. Specifically, since the intrinsic frequency can be easily adjusted, a piezoelectric actuator capable of exhibiting highly efficient drive performance in accordance with various drive conditions can be inexpensively provided with stable quality.

Incidentally, an ellipsoidal movement as a result of superposition of the stretching vibration and bending vibration is achieved on a free end (i.e. an end not supported by the support member where the anti-node of bending vibration is located) of the vibrating member, so that the object can be driven with high efficiency.

The piezoelectric actuator (ultrasonic motor) may be used for zooming mechanism and auto-focusing mechanism of a camera, ink-jet head and paper-feeding mechanism of a printer, and drive mechanism and attitude correcting mechanism of movable toys, for instance.

In the piezoelectric actuator according to the above aspect of the invention, the support member may preferably include a plurality of support members that are disposed substantially axisymmetrically with respect to a displacing direction of the stretching vibration of the vibrating member, and a vibration locus of the free end may preferably be switched substantially axisymmetrically with respect to the displacing direction of the stretching vibration of the vibrating member.

In order to axisymmetrically switch the vibration locus of the free end, a plurality of drive electrodes may be point-symmetrically provided with respect to the center of the piezoelectric element and voltage-applied drive electrodes may be axisymmetrically switched with respect to the displacing direction of the stretching direction, which results in change in the vibrating action of the vibrating member. Accordingly, the vibration locus is axisymmetrically switched with respect to the stretching direction and rotary direction of the vibration locus is reversely shifted.

The switch in the vibration locus allows switching the moving direction of the object to be driven such as a rotor. In this case, the object is driven in a predetermined normal direction and reverse direction.

According to the above arrangement, since the support members are substantially axisymmetrically provided with respect to the displacing direction of the stretching vibration, the vibrating member can be supported by the support members in a balanced manner irrespective of which vibration loci the free end traces, so that the vibrating member can be stably actuated.

Further, the adjustment of the intrinsic frequencies of the stretching vibration and the bending vibration using the respective support members allows symmetric arrangement of both of the vibration loci, so that drive performance during a mode driven by one of the vibration loci and another mode driven by the other of the vibration loci can be made substantially equal. Alternatively, predetermined difference in performance can be provided without equating the drive performance during the two operation modes (i.e. adjusting the difference between the intrinsic frequencies during the two operation modes).

An electronic device according to further aspect of the invention includes the above-described piezoelectric vibrator.

According to the above arrangement, since the above-described piezoelectric vibrator is provided, the same function and advantages as described above can be obtained. In other words, the intrinsic frequency of the piezoelectric vibrator can be easily adjusted and production cost can be reduced.

The electronic device according to the above aspect of the invention may preferably be a timepiece including a timer and a time information display that displays information clocked by the timer.

The piezoelectric actuator is installed into the timepiece as a drive section of a display such as calendar and time.

The advantage of installing a piezoelectric actuator is that a piezoelectric actuator, as compared with a stepping motor and the like, is free from influence of magnetism, is highly responsive and adapted to minute feed, is advantageous for reduction in size and thickness and has high torque.

BRIEF DESCRIPTION OF THE DRAWINGS

The invention will be described with reference to the accompanying drawings, wherein like numbers reference like elements.

DESCRIPTION OF EXEMPLARY EMBODIMENT(S)

Figure 1:
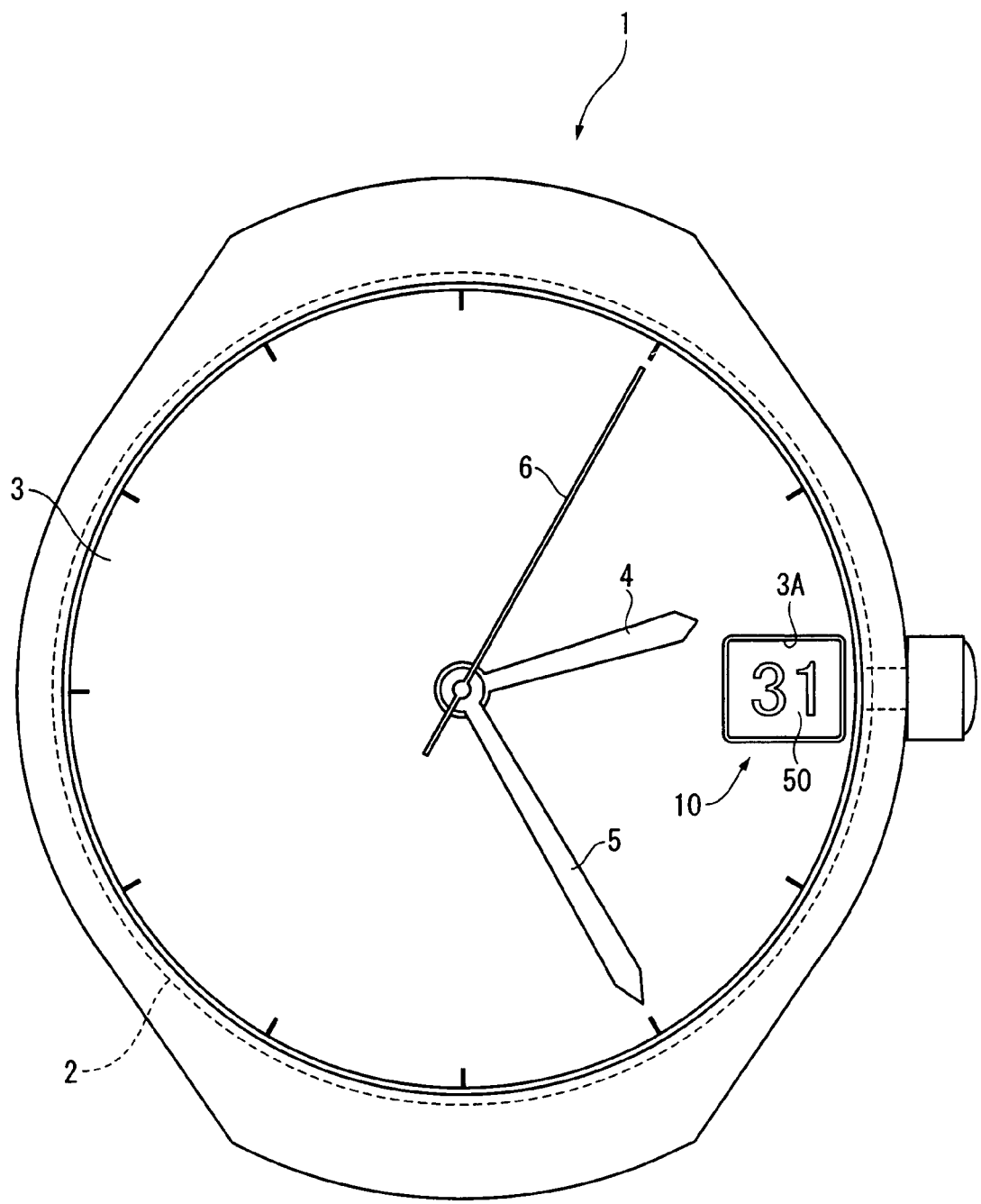
FIG. 1 shows an exterior of an electronic timepiece according to an exemplary embodiment of the invention.

An exemplary embodiment of the invention will be described below with reference to the attached drawings.

Incidentally, the same reference numeral will be attached to the same components as those described above, whereby description thereof will be simplified or omitted.

1 Entire Arrangement

FIG. 1 shows an exterior of an electronic timepiece 1 according to an exemplary embodiment. The electronic timepiece 1 is a wristwatch including a movement 2 (clock), a time information display for displaying time which includes dial plate 3, hour hand 4, minute hand 5 and second hand 6, and a date display device 10 for displaying date through a window 3A provided on the dial plate 3.

2 Arrangement of Date Display Device

Figure 2:
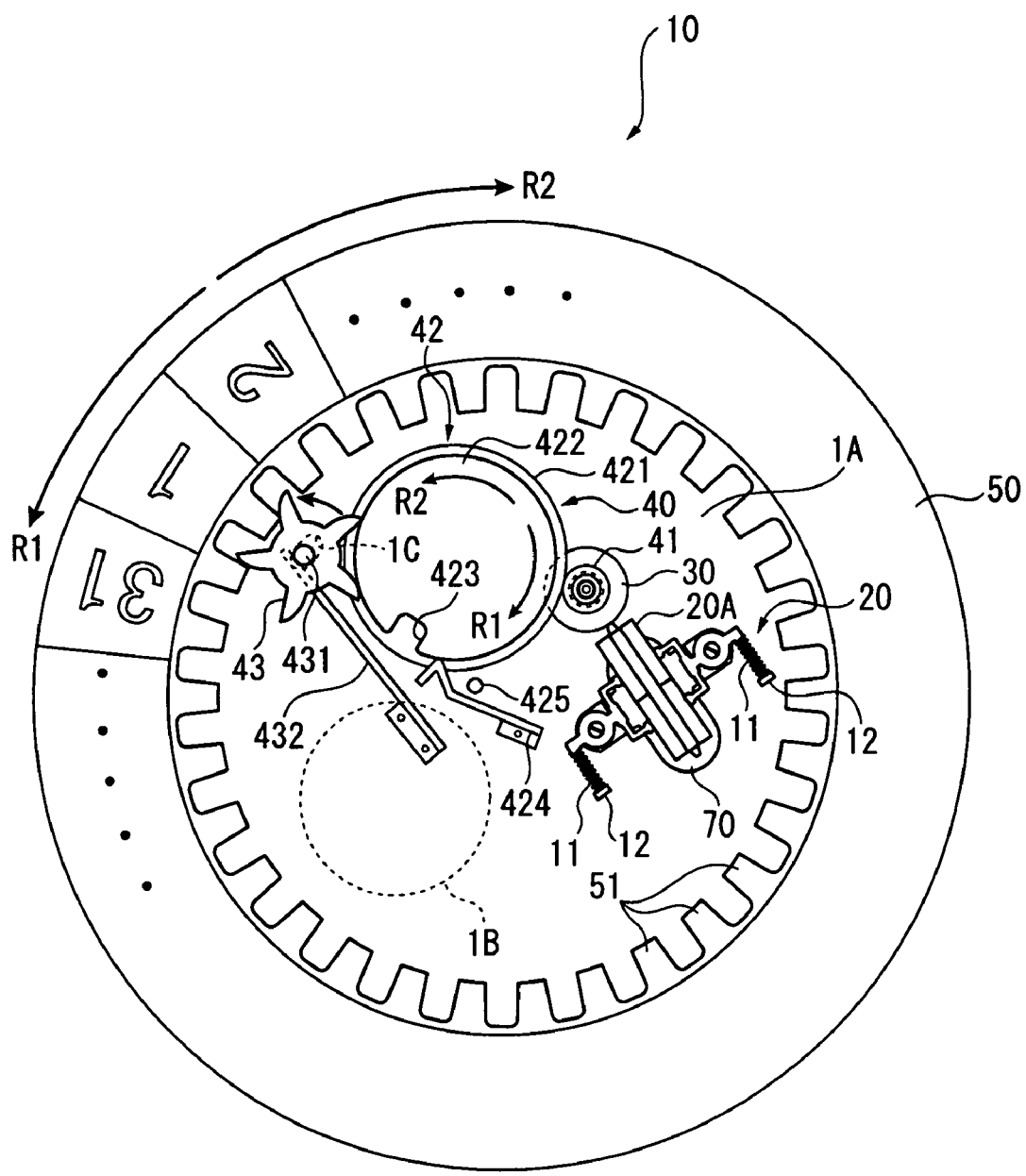
FIG. 2 is a plan view showing a date display device of the exemplary embodiment.

FIG. 2 is a plan view showing a date display device 10 supported by a bottom plate 1A. The date display device 10 includes a piezoelectric actuator 20, a rotor 30 (object to be driven) rotated by the piezoelectric actuator 20, a deceleration gear train 40 for decelerating and transmitting the rotation of the rotor 30, and a date dial 50 rotated by a drive force transmitted through the deceleration gear train 40.

The rotor 30 is rotated by the piezoelectric actuator 20 at the time of change of date, or in correcting the date. The deceleration gear train 40 includes a gear 41 disposed coaxially and turned integrally with the rotor 30, a date driving intermediate dial 42 meshed with the gear 41, and a date driving dial 43.

Incidentally, a stepping motor (not shown) driven by a pulse signal generated by a crystal oscillator, a hand-driving gear train (not shown) connected to the stepping motor to drive the hour hand 4, minute hand 5 and second hand 6 and a battery 1B are provided on the lower (back) side of the bottom plate 1A. The battery 1B supplies power to respective circuits including the stepping motor, the piezoelectric actuator 20 and driving circuit (not shown) for applying alternate voltage to the piezoelectric actuator 20.

The date driving intermediate dial 42 includes a large-diameter part 421 and a small-diameter part 422. The small-diameter part 422 has a cylindrical shape a little smaller than the large-diameter part 421, which includes an approximately square notch 423 on the outer circumference thereof. The small-diameter part 422 is concentrically fixed on the large-diameter part 421. The gear 41 on the upper side of the rotor 30 is meshed with the large-diameter part 421, so that the date driving intermediate dial 42 is rotated in accordance with the rotation of the rotor 30.

A plate spring 424 is provided on the bottom plate 1A provided on the lateral side of the date driving intermediate dial 42. A base end of the plate spring 424 is fixed on the bottom plate 1A and a distal end is bent in an approximately V-shape. The distal end of the plate spring 424 is adapted to go into and out of the notch 423 of the date driving intermediate dial 42. A contact piece 425 is located at a position adjacent to the plate spring 424, the contact piece 425 being in contact with the plate spring 424 when the date driving intermediate dial 42 is rotated and the distal end of the plate spring 424 enters into the notch 423. A predetermined voltage is applied on the plate spring 424 and the voltage is applied on the contact piece 425 when the plate spring 424 contacts the contact piece 425. Accordingly, date-forwarding condition can be detected by sensing the voltage of the contact piece 425, thereby detecting rotation amount of the date dial 50 per a day.

Incidentally, the rotation amount of the date dial 50 may not be detected by the plate spring 424 and the contact piece 425 but may be detected by a sensor for detecting rotary condition of the rotor 30 and the date driving intermediate dial 42 to output a predetermined pulse signal, which specifically may be various rotary encoder including known photo reflector, photo interrupter and MR sensor.

The date dial 50 has a ring-shape and an inner gear 51 is formed on the inner circumference thereof. The date driving gear 43 has a five-tooth gear, which meshes with the inner gear 51 of the date dial 50. Further, a shaft 431 is provided at the center of the date driving gear 43, the shaft 431 being loosely inserted into a through-hole 1C formed on the bottom plate 1A. The through-hole 1C is elongated along a circumferential direction of the date dial 50. The date driving dial 43 and the shaft 431 are biased toward upper right direction in FIG. 2 by the plate spring 432 fixed on the bottom plate 1A. The biasing of the plate spring 432 prevents shaky movement of the date dial 50.

3 Arrangement of Piezoelectric Actuator

Next, the piezoelectric actuator 20 will be described. The piezoelectric actuator 20 is actuated at the time of change of date or in correcting the date, which drives the rotor 30 by alternate voltage supplied by a driving circuit (not shown).

Figure 3:
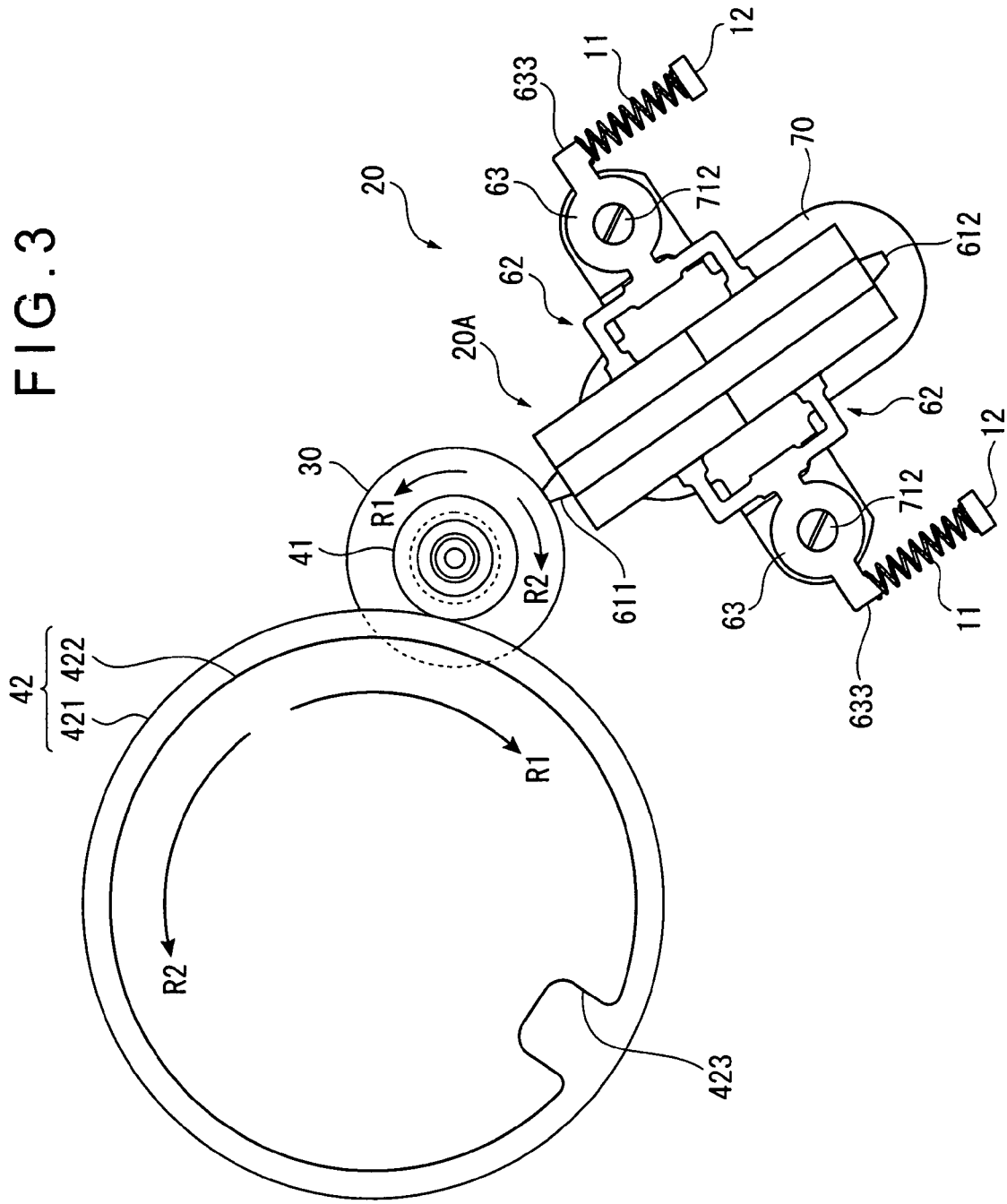
FIG. 3 is a partially enlarged illustration of FIG. 2.
Figure 4:
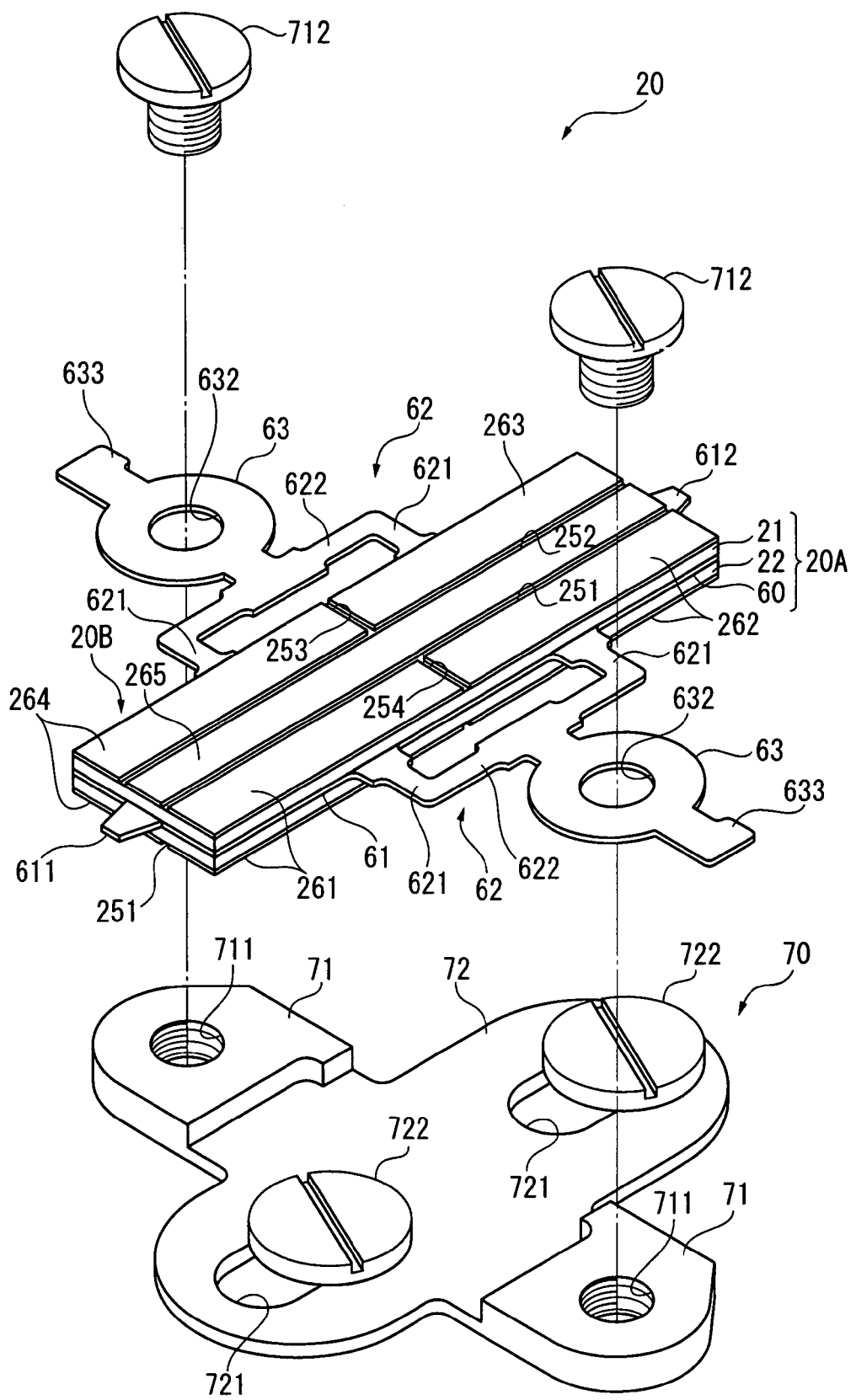
FIG. 4 is an exploded perspective view showing a piezoelectric actuator of the exemplary embodiment.
Figure 5:
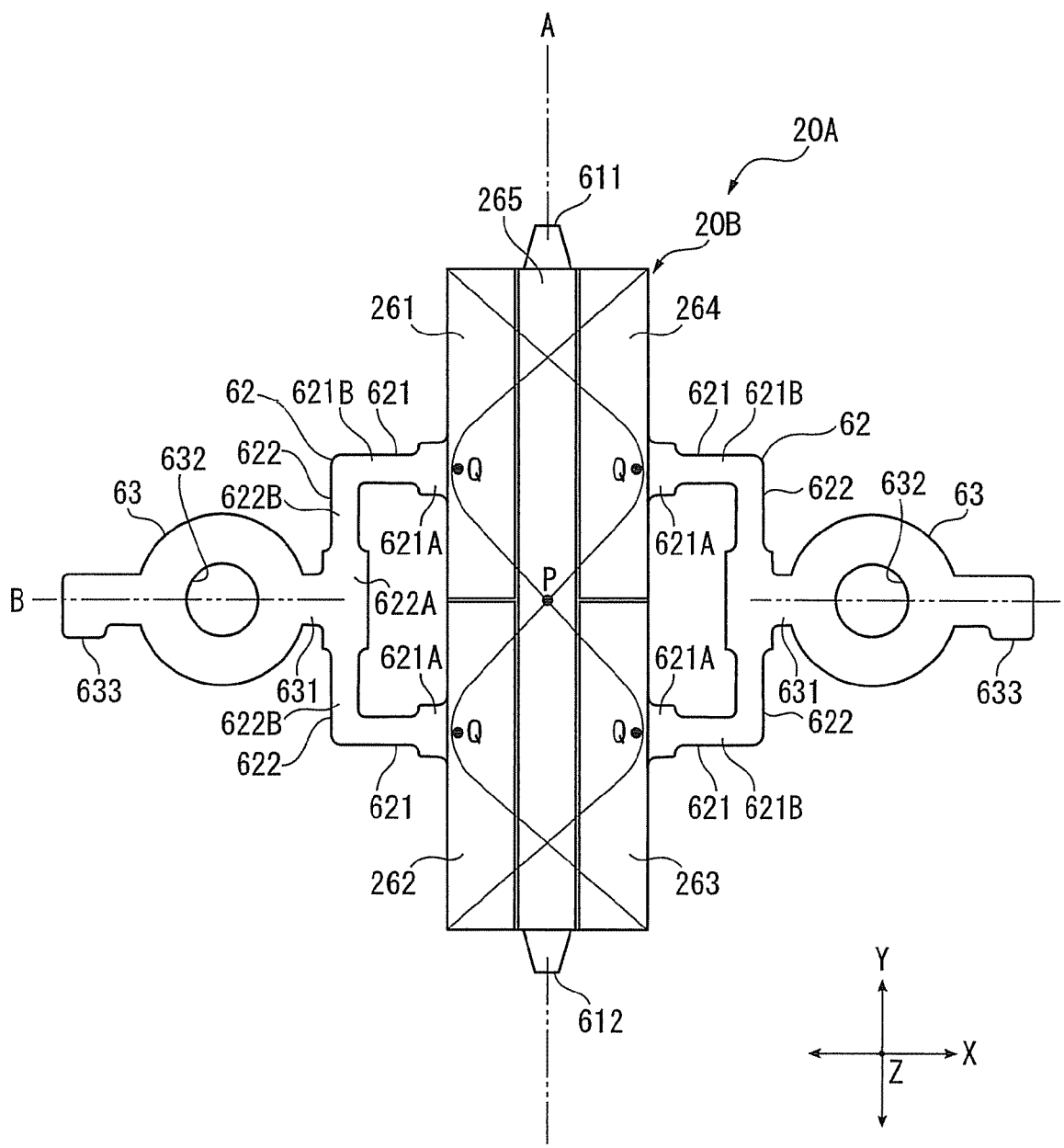
FIG. 5 is a plan view showing a piezoelectric vibrator of the exemplary embodiment.

FIG. 3 is a partially enlarged illustration of FIG. 2, FIG. 4 is an exploded perspective view of the piezoelectric actuator 20, and FIG. 5 is a plan view showing a piezoelectric vibrator 20A as a main body of the piezoelectric actuator 20.

As shown in FIG. 4, the piezoelectric actuator 20 includes the piezoelectric vibrator 20A having laminated body of two rectangular-plate piezoelectric elements 21 and 22 and an electrically conductive reinforcing plate 60 interposed between the piezoelectric elements 21 and 22, and a circuit board (not shown) on which a drive circuit is installed. The piezoelectric actuator 20 is attached and fixed on the bottom plate 1A (FIG. 2) in a manner slidable by a slider 70.

Detailed explanation of the arrangement of the piezoelectric vibrator 20A constituting the piezoelectric actuator 20 and a process for adjusting the intrinsic frequency of the piezoelectric vibrator will be provided below.

Arrangement of Piezoelectric Element

The piezoelectric elements 21 and 22 are made of material selected from lead zirconium titanate (PZT [registered trade name]), crystal, lithium niobate, barium titanate, lead titanate, lead metaniobate, polyvinylidene fluoride, zinc lead niobate, scandium lead niobate and the like.

An electrode formed by plating, sputtering, and vacuum evaporation using nickel, gold and the like is provided on the surface of the piezoelectric elements 21 and 22, which is divided by grooves 251 to 254 formed by etching and the like to define five drive electrodes 261 to 265. Specifically, the electrode is divided into three equal parts by two grooves 251 and 252 extending along the longitudinal direction of the piezoelectric element 21, and two of the divided electrodes located on both sides in width direction are halved by the grooves 253 and 254 extending along the width direction of the piezoelectric element 21 to provide the five drive electrodes 261 to 265.

Incidentally, drive electrodes 261 to 265 similar to those of the front-side piezoelectric element 21 are provided on the backside piezoelectric element 22 opposed to the slider 70, where the drive electrode 261 is located on the backside of the drive electrode 261.

The drive electrodes 261 to 265 and the reinforcing plate 60 are connected to the drive circuit through lead wire and circuit board (both not shown) and voltage is applied on the piezoelectric elements 21 and 22 through the respective drive electrodes 261 to 265 and the reinforcing plate 60. Incidentally, the drive electrodes 261 to 265 are point-symmetrically provided with respect to plane-center of the piezoelectric elements 21 and 22.

Arrangement of Reinforcing Plate

The reinforcing plate 60 is formed of electrically conductive material such as stainless steel, which integrally includes rectangular body 61 on which the piezoelectric elements 21 and 22 are disposed, a pair of support members 62 respectively protruding on both sides of the body 61 in width direction, and a fixing portion 63 fixed on the slider 70.

The body 61 is vibrated when voltage is applied on the piezoelectric elements 21 and 22, which forms a substantially rectangular-plate vibrating member 20B together with the piezoelectric elements 21 and 22. The vibrating member 20B excites a longitudinal primary vibration and a bending secondary vibration when a voltage is applied on the piezoelectric elements 21 and 22.

Projections 611 and 612 projecting in longitudinal direction are respectively formed approximately at the center of both short sides of the body 61. The projection 611 is abutted on a side of the rotor 30. Incidentally, the piezoelectric actuator 20 is disposed approximately vertically relative to the side of the rotor 30 and the direction of the projection 611 is aligned with the circumferential direction of the rotor 30 (FIG. 3). Further, the plane of the vibrating member 20B is disposed orthogonal to the shaft of the rotor 30. Even when the projection 611 is abutted on the rotor 30, the other projection 612 contributes to excite a vibration so that wide amplitude can be secured and excellent start-up performance can be obtained.

Node of bending vibration of the vibrating member 20B is represented as P and anti-node of the bending vibration is represented as B in FIG. 5. The ends of vibrating member 20B in longitudinal direction and the projections 611 and 612 are free ends.

Arrangement of Support Member

Next, the support member 62 bearing the most characteristic feature in the exemplary embodiment will be described below with reference to FIG. 5.

The support members 62 are axisymmetrically provided with respect to a centerline A of vibrating member 20B, which support the vibrating member 20B in a vibratable manner. The respective support members 62 includes a pair of first support sections 621 extending in parallel from the outer edge of the vibrating member 20B along the width direction of the vibrating member 20B, and a pair of second support sections 622 extending from an end of the respective first support sections 621 in the longitudinal direction of the vibrating member 20B, so that the support members 62 form a substantially C-shape in plan view.

Among a plurality of anti-nodes Q of the bending vibration of the vibrating member 20B, the respective first support sections 621 are provided adjacent to anti-nodes Q located between the free ends. Further, the width of the first support section 621 continuous with the second support section 622 is narrower than the width adjacent to the vibrating member 20B, thereby defining a first rigid portion 621A and a second rigid portion 621B less rigid than the first rigid portion 621A. The portion of the first rigid portion 621A intersecting with the long side of the vibrating member 20B has a fillet shape.

The respective second support sections 622 extend from an end of the first support sections 621 in a direction substantially orthogonal to the first support sections 621 to connect the first support sections 621. The second support sections 622 are connected to the fixing portion 63 at the rectangular first rigid portion 622A formed at the intersection of the second support sections 622 through a narrow portion 631. The width of the second support section 622 continuous with the first support section 621 is narrower than the first rigid portion 622A, so that the rigidity of the second rigid portion 622B located on the side of the first support section 621 is lower than the first rigid portion 622A.

The fixing portion 63 has a hole 632 approximately at the center thereof and includes approximately L-shaped projection 633. The narrow section 631 and the hole 632 are disposed on a nodal line B of the longitudinal vibration passing through a plane center of the vibrating member 20B. Incidentally, the node P of the bending vibration is located at the gravity center of the vibrating member 20B and the piezoelectric vibrator 20A is fixed at a position adjacent to both of the nodes of the longitudinal vibration and the bending vibration.

Arrangement of Slider

Next, the slider 70 will be described below again with reference to FIG. 4.

The slider 70 includes a pair of rising portions 71 on which the respective fixing portions 63 of the piezoelectric vibrator 20A are fixed and a slide section 72 integrally formed between the rising portions 71 and slidably supported by the bottom plate 1A (FIG. 2).

A screw hole 711 is provided on the respective rising portions 71. A screw 712 is screwed into the screw hole 711 through the hole 632 of the fixing portion 63 to secure the piezoelectric vibrator 20A on the slider 70. Incidentally, a gap is provided between the piezoelectric vibrator 20A secured on the rising portion 71 and the slide section 72 so that the piezoelectric vibrator 20A does not interfere with screws 722 and the like during vibration.

The slide section 72 is disposed along a groove (not shown) formed on the bottom plate 1A (FIG. 2) and has two elongated holes 721 oriented along the longitudinal direction of the piezoelectric vibrator 20A. The screws 722 are respectively inserted into the elongated holes 721 to be screwed into the bottom plate 1A. Accordingly, the piezoelectric vibrator 20A is mounted on the bottom plate 1A in a manner slidable by the slider 70.

As shown in FIGS. 2 and 3, the piezoelectric vibrator 20A and the slider 70 that are integrally assembled are biased in the longitudinal direction of the piezoelectric vibrator 20A by two helical compression springs 11 provided on the bottom plate 1A. The springs 11 are engaged between spring attachments 12 provided on the bottom plate 1A and the projections 633 provided on the fixing portion 63 of the piezoelectric vibrator 20A. Pressure caused by the springs 11 generates a predetermined friction force between the projection 611 of the piezoelectric vibrator 20A and the rotor 30, which enhances transmission efficiency of the vibration from the piezoelectric actuator 20 toward the rotor 30.

4 Movement of Piezoelectric Actuator

Next, the movement of the piezoelectric actuator 20 will be described below with reference to FIGS. 5, 6 and 7. The vibration locus of the projection 611 is changed by switching voltage applied on the drive electrodes 261 to 265 of the piezoelectric elements 21 and 22 in an axisymmetric manner with respect to the center line A of the vibrating member 20B.

Specifically, when the voltage is applied solely on the drive electrodes 261, 263 and 265, the drive electrodes 261, 263 and 265 are expanded and contracted along the longitudinal direction Y of the vibrating member 20B and within a plane of the vibrating member 20B containing rotary direction of the rotor 30 (FIG. 3). At this time, imbalance of the vibrating action of the vibrating member 20B in the width direction X induces bending point-symmetric vibration around a gravity center of the vibrating member 20B as shown in FIG. 6. The vibrating action of the vibrating member 20B is schematically shown with a two-dot chain line in FIG. 6. The vibrating member 20B is bent in the longitudinal direction Y by the bending vibration, however, is not bent in the longitudinal direction Y at the portion of the anti-node Q (FIG. 5) where the amplitude of the bending vibration is at the maximum, so that the moment is hardly applied on the support member 62 located adjacent to the anti-node Q.

As described above, the vibrating member 20B is vibrated in a mixed mode of the longitudinal vibration and the bending vibration and the projection 611 traces an ellipsoidal vibration locus E1 as a Lissajous figure based on phase difference between the longitudinal vibration and the bending vibration. Long axis of the vibration locus E1 is substantially aligned with a direction connecting the drive electrodes 262 and 264 (FIG. 5). The rotor 30 is intermittently driven in tangential direction of the vibration locus E1 and, in accordance with continuous ellipsoidal movement of the projection 611 at a predetermined drive frequency, the rotor 30 is rotated in positive direction R1 (FIG. 3) at a predetermined speed. At this time, the piezoelectric actuator 20 is driven in a normal rotation mode for changing the displayed date in accordance with clocked time, where the date dial 50 (FIG. 2) is forwarded in the positive direction R1 through the deceleration gear train 40 by the normal rotation of the rotor 30.

Figure 6:
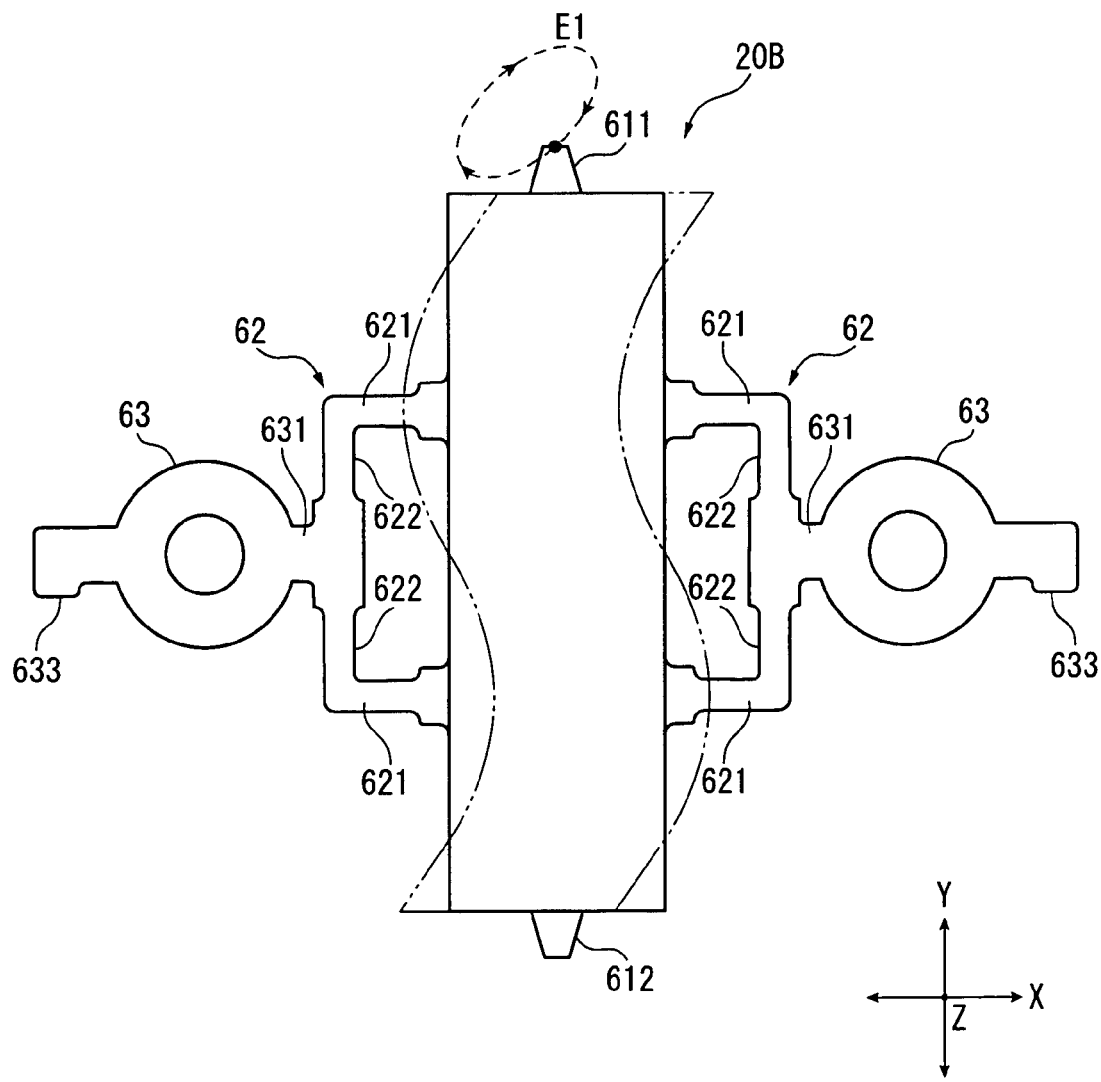
FIG. 6 is a plan view illustrating a movement of the piezoelectric vibrator of the exemplary embodiment.
Figure 7:
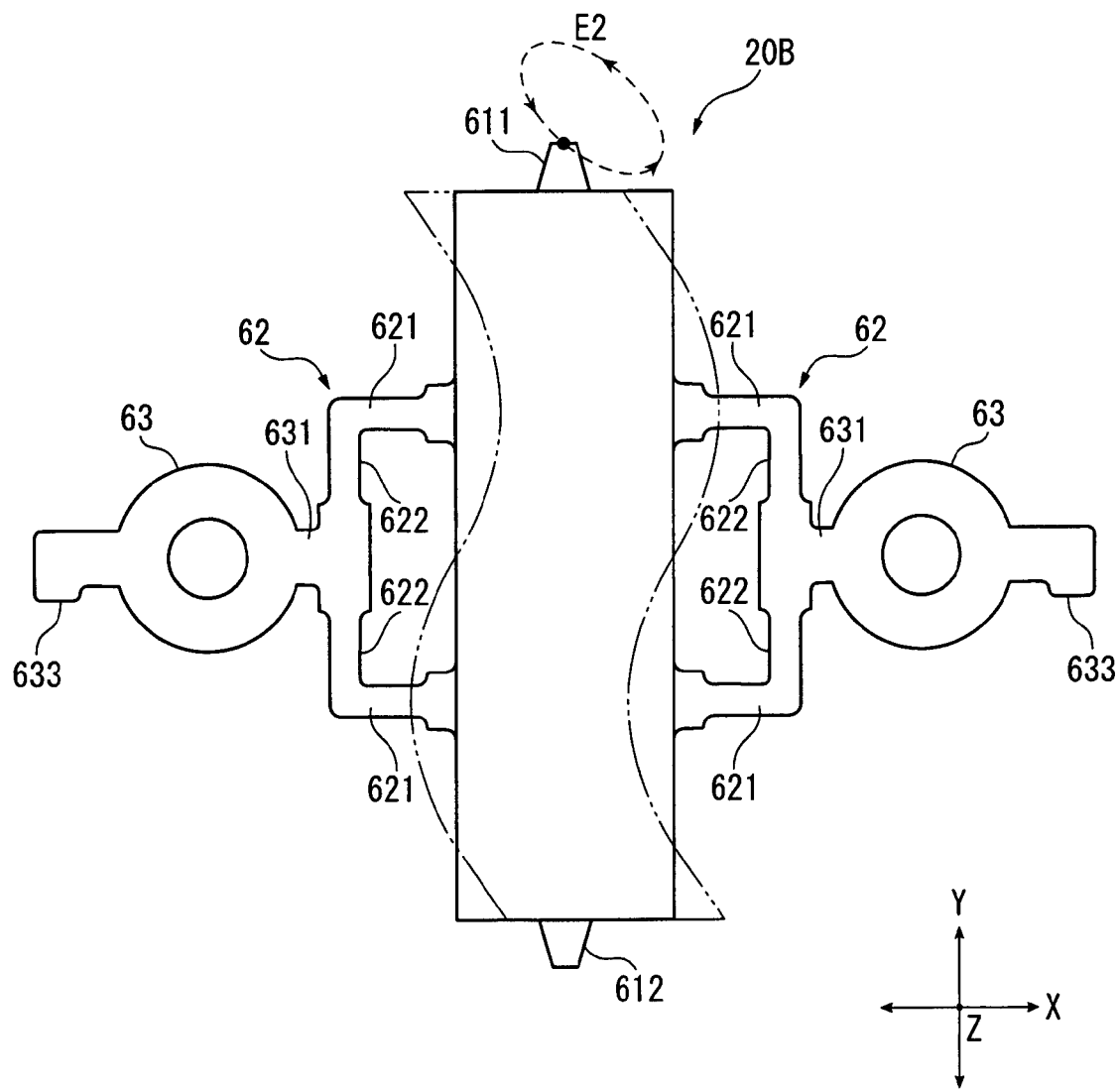
FIG. 7 is a plan view illustrating a movement of the piezoelectric vibrator of the exemplary embodiment.

On the other hand, when a voltage is applied solely on the drive electrodes 262, 263 and 264, the vibrating action of the vibrating member 20B becomes axisymmetric as compared with those shown in FIG. 6 with respect to the longitudinal direction of the vibrating member 20B as shown in two-dot chain line in FIG. 7, and the projection 611 traces an ellipsoidal vibration locus E2. The long axis of the vibration locus E2 is substantially aligned with a direction connecting the drive electrodes 261 and 263 (FIG. 5). The vibration locus E2 and the above-mentioned vibration locus E1 are axisymmetric with respect to an axis line extending along stretching direction of the longitudinal vibration and passing the gravity center of the vibrating member 20B and are mutually reversed. The rotor 30 is driven in a tangential direction of the vibration locus E2 and is rotated in a reverse direction R2 (FIG. 3). At this time, the piezoelectric actuator 20 is in a reverse mode for changing the date in correcting the displayed date, where the date dial 50 (FIG. 2) is reversely fed by the reverse rotation of the rotor 30 through the deceleration gear train 40.

5 Intrinsic Frequency Adjusting Method of Piezoelectric Vibrator

The dimension and thickness of the piezoelectric elements 21 and 22 and dividing arrangement of the drive electrodes 261 to 265 of the above-described piezoelectric vibrator 20A are designed so that the longitudinal vibration and the bending vibration occur simultaneously to achieve the ellipsoidal vibration loci E1 and E2. However, on account of errors in assembling the piezoelectric elements 21 and 22 and the reinforcing plate 60 or the like, the intrinsic frequency of the piezoelectric element may vary and desired drive characteristics of the piezoelectric actuator 20 may not be obtained. Accordingly intrinsic frequency adjusting process is required. Adjustment of the intrinsic frequency (i.e. resonance frequency) of the piezoelectric element 20A will be described below.

The drive frequency of the voltage supplied to the piezoelectric vibrator 20A is determined considering resonance point of the longitudinal vibration and resonance point of the bending vibration of the piezoelectric vibrator 20A.

Figure 8A:
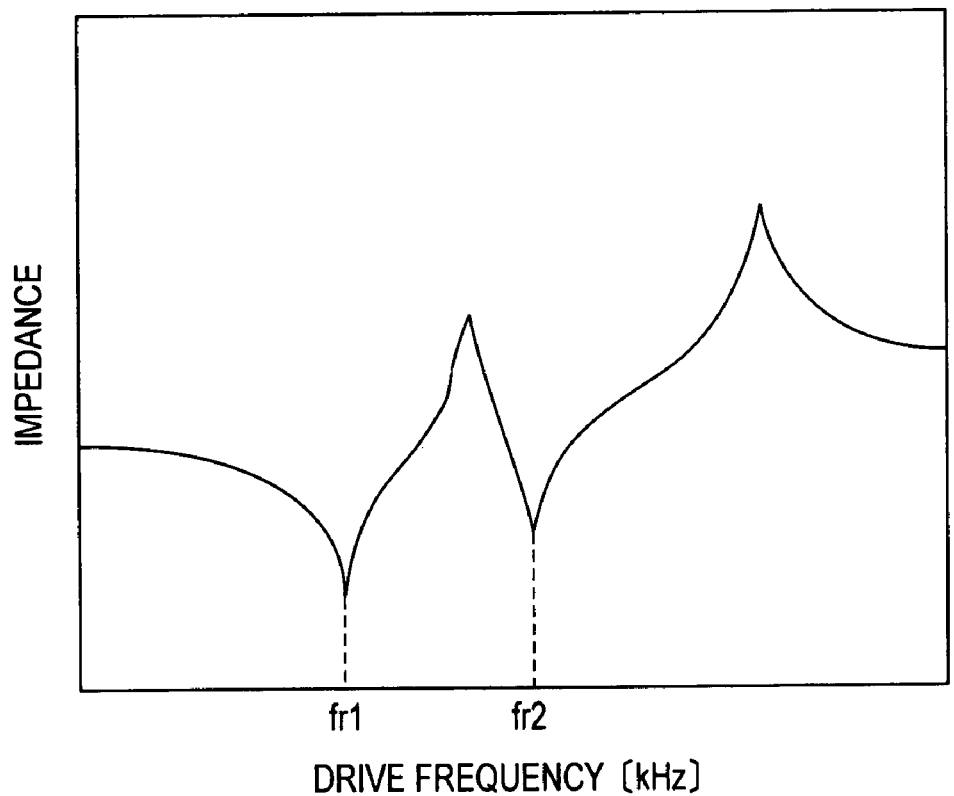
FIG. 8A is a graph showing a relationship between drive frequency and impedance of the piezoelectric vibrator of the exemplary embodiment.
Figure 8B:
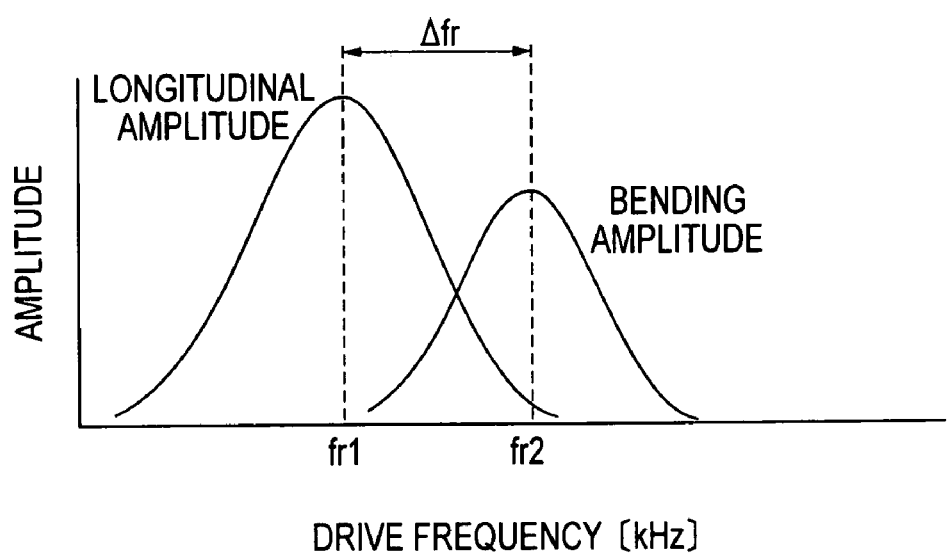
FIG. 8B is a graph showing a relationship between drive frequency and amplitude of longitudinal vibration and bending vibration of the piezoelectric vibrator of the exemplary embodiment.

FIG. 8A shows a relationship between the drive frequency and the impedance of the piezoelectric vibrator 20A and FIG. 8B shows a relationship between the drive frequency and the amplitudes of the longitudinal vibration and the bending vibration of the piezoelectric vibrator 20A. As shown in FIG. 8A, there are two points where impedance becomes minimum relative to drive frequency. One of the two points (with lower frequency) is a resonance point at which the amplitude of the longitudinal vibration is maximized, and the drive frequency at the resonance point is defined as longitudinal resonance frequency fr1. The other of the two points (with higher frequency) is a resonance point where the amplitude of the bending vibration is maximized, and the drive frequency at this resonance point is defined as bending resonance frequency fr2.

Incidentally, the drive voltage may have any waveform such as rectangular wave, sine wave, sawtooth waveform and triangular waveform.

As shown in FIGS. 8A and 8B, both of the amplitudes of longitudinal vibration and the bending vibration can be obtained when the piezoelectric vibrator 20A is driven between the longitudinal resonance frequency fr1 and the bending resonance frequency fr2, where the projection 611 traces the ellipsoidal vibration locus E1 or E2. When the drive frequency is shifted from the longitudinal resonance frequency fr1 to the bending resonance frequency fr2, the amplitude of the bending vibration gradually surpasses the amplitude of the longitudinal vibration, thereby changing the ellipsoidal locus traced by the projection 611.

Based on the above principle, in order to adjust the intrinsic frequency of the piezoelectric vibrator 20A according to the exemplary embodiment, intrinsic frequency of one of the longitudinal vibration and the bending vibration is adjusted relative to the intrinsic frequency of the other to change the difference between the bending resonance frequency fr2 and the longitudinal resonance frequency fr1 ($\Delta$fr in FIG. 8B). When $\Delta$fr is too great, the displacement of one of the longitudinal vibration and the bending vibration dominates the other and the ellipsoidal movement cannot be achieved. On the other hand, when the $\Delta$fr is too small, since the bandwidth of the drive frequency is narrow, the frequency control becomes difficult and the movement of the vibrator is likely to be unstable.

In order to adjust the intrinsic frequency of the piezoelectric vibrator 20A, the support member 62 (FIG. 5) that supports the vibrating member 20B is used. As described above, since the support member 62 is not bent in the longitudinal direction Y during the vibration of the vibrating member 20B, only the stretching displacement in Y direction by the longitudinal vibration and the displacement in X direction by the bending vibration are applied on the support member 62. Specifically, the first support section 621 extending in X direction absorbs the displacement in Y direction by the longitudinal vibration and the second support section 622 absorbs the displacement in X direction by the bending vibration. The longitudinal vibration and the bending vibration are mutually isolated by the first and the second support sections 621 and 622, the intrinsic frequencies of the longitudinal vibration and the bending vibration can be independently adjusted.

The dimension and the shape of the first and the second support sections 621 and 622 are adjusted by cutting an outer edge of the first and the second support sections 621 and 622. Incidentally, when the first and the second support sections 621 and 622 are cut, the narrower second rigid portions 621B and 622B are cut and the first rigid portions 621A and 622A are not cut.

Cutting the first support section 621 reduces restriction on the vibrating member 20B in Y direction by the first support section 621, which results in reduction in intrinsic frequency of the longitudinal vibration. $\Delta$fr increases in accordance with the cutting since the cutting hardly affects on the intrinsic frequency of the bending frequency.

On the other hand, cutting the second support section 622 reduces restriction on the vibrating member 20B in X direction by the second support section 622, which results in reduction in intrinsic frequency of the bending vibration. $\Delta$fr increases in accordance with the cutting since the cutting hardly affects on the intrinsic frequency of the longitudinal frequency.

In order to adjust the intrinsic frequency, a plurality of samples of the piezoelectric vibrator 20A are tested to determine what degree of cutting of the first support section 621 results in what degree of the change in the intrinsic frequency of the longitudinal vibration, and what degree of cutting the second support section 622 results in the change in the intrinsic frequency of the bending vibration, thereby respectively obtaining adjustment amount of $\Delta$fr when the first support section 621 is used and adjustment amount of $\Delta$fr when the second support section 622 is used. The adjustment amount is preferably obtained in a stepwise fashion in accordance with the degree (dimension etc.) of the cutting.

Based on the adjustment amount of $\Delta$fr, standard value of $\Delta$fr determined based on drive characteristics required for the piezoelectric actuator 20 and measured value of $\Delta$fr of each piezoelectric vibrator 20A, one of the first and the second support sections 621 and 622 to be used for adjustment is cut by an end mill, ultrasonic cutter, laser cutter and the like.

Both of the first and the second support sections 621 and 622 may be cut as necessary. However, it is easy and less time-consuming to adjust the difference between the intrinsic frequencies of the longitudinal vibration and the bending vibration using only one of the first and the second support sections.

Since the piezoelectric actuator 20 of the exemplary embodiment has the normal mode for driving the rotor 30 in the positive direction R1 and the reverse mode for driving the rotor 30 in the reverse direction R2, $\Delta$fr is adjusted for the normal mode and the reverse mode. In the exemplary embodiment, $\Delta$fr is not adjusted per each normal mode and reverse mode, but the intrinsic frequency is adjusted so that the difference between $\Delta$fr in normal mode and $\Delta$fr in reverse mode is eliminated.

The $\Delta$fr in the normal mode and $\Delta$fr in the reverse mode may not be completely coincided and it is sufficient for the difference between the $\Delta$fr in the normal mode and $\Delta$fr in the reverse mode to be within a predetermined desired range.

As described above, since the value of $\Delta$fr can be appropriately adjusted by cutting the first and the second support sections 621 and 622, desired ellipsoidal vibration loci E1 and E2 can be achieved for each piezoelectric vibrator 20A.

6 Effects of Embodiment

According to the above-described exemplary embodiment, following advantages can be obtained.

(1) Since the support member 62 is provided adjacent to anti-node Q of bending vibration of the piezoelectric actuator 20 that is vibrated in a mixed mode of longitudinal vibration and bending vibration, the moment generated by the bending vibration, which is usually applied when the support member 62 is disposed on an outer edge of the vibrating member 20B, is hardly applied on the support member 62. Accordingly, it can be safely regarded that only the stretching displacement caused by the longitudinal vibration and bending displacement caused by the bending vibration are applied on the support member 62, so that the difference $\Delta$fr between the intrinsic frequency of the longitudinal vibration and the intrinsic frequency of the bending vibration can be adjusted to a desired value by adjusting at least one of the first and the second support sections 621 and 622.

In other words, since the intrinsic frequency of the piezoelectric vibrator 20A having a plurality of vibration modes including the longitudinal vibration and the bending vibration can be easily and speedily adjusted in accordance with resonance point, productivity can be improved and manufacturing cost of the vibrator can be reduced. Further, deviation in the intrinsic frequency can be eliminated to achieve desired vibration characteristics.

(2) Sufficient amplitudes can be secured for both of the longitudinal vibration and the bending vibration by adjusting the intrinsic frequencies of the longitudinal vibration and the bending vibration by the first and the second support sections 621 and 622, and the ellipsoidal vibration loci E1 and E2 traced by a part of the vibrating member 20B can be stabilized for respective piezoelectric vibrators 20A. Accordingly, piezoelectric vibrator 20A satisfying desired vibration characteristics can be stably provided.

(3) Since the support member 62 is provided on an outer edge of the vibrating member 20B, the thickness of the piezoelectric vibrator 20A can be reduced.

(4) Since the support member 62 is formed in a C-shape by the pair of first support sections 621 and the second support sections 622 and the support member 62 and the vibrating member 20B are arranged in a continuous circle, the vibrating member 20B can be stably supported. Accordingly, damage on the vibrating member 20B can be avoided even when excessive displacement and disturbance is applied.

(5) Since the fixing portion 63 is disposed along the nodal line B of the longitudinal vibration, damping of longitudinal vibration caused by the presence of fixing portion 63 can be restrained to the minimum. Accordingly, the displacement of the vibrating member 20B can be further increased and the energy required for exciting the vibration can be reduced, thereby enhancing drive efficiency.

(6) The first support section 621 and the second support section 622 include the wide first rigid portions 621A and 622A at a portion to secure strength where a stress on account of external force by the rotor 30 etc. is the most likely to be concentrated and the narrow second rigid portions 621B and 622B at a portion where not much stress is concentrated. Accordingly, damage on account of abnormal vibration by external force from the rotor etc. and disturbance generated by a shock can be avoided, and drive efficiency can be improved by preventing dissipation of vibration energy through the support member 62.

(7) Since the second rigid portions 621B and 622B are cut during adjustment using the first and the second support sections 621 and 622, the strength of the first rigid portions 621A and 622A can be maintained, thereby further securely preventing damage thereon.

(8) Since the pair of support sections 62 are formed on both sides of the vibrating member 20B substantially axisymmetrically with respect to the displacing direction of the longitudinal direction, the vibrating member 20B can be supported in a balanced manner from both sides by the support member 62 irrespective of which vibration loci E1 and E2 the projection 611 traces, so that the vibrating member can be stably actuated.

Further, the adjustment of the intrinsic frequencies of the longitudinal vibration and the bending vibration using the respective support members 62 allows symmetric arrangement of the vibration loci E1 and E2, so that drive performance during normal mode and reverse mode can be made substantially equal. Alternatively, predetermined difference in performance can be provided without equating the drive performance during the two operation modes (i.e. adjusting the difference between the intrinsic frequencies during the two operation modes).

(9) As described above, since the intrinsic frequency can be easily adjusted, piezoelectric actuator exhibiting highly efficient drive performance in accordance with various drive conditions can be provided with stable quality and less cost.

Modifications

The scope of the invention is not limited to the above-described exemplary embodiment, and various modifications and improvements are possible as long as an object of the invention can be achieved.

Figure 9:
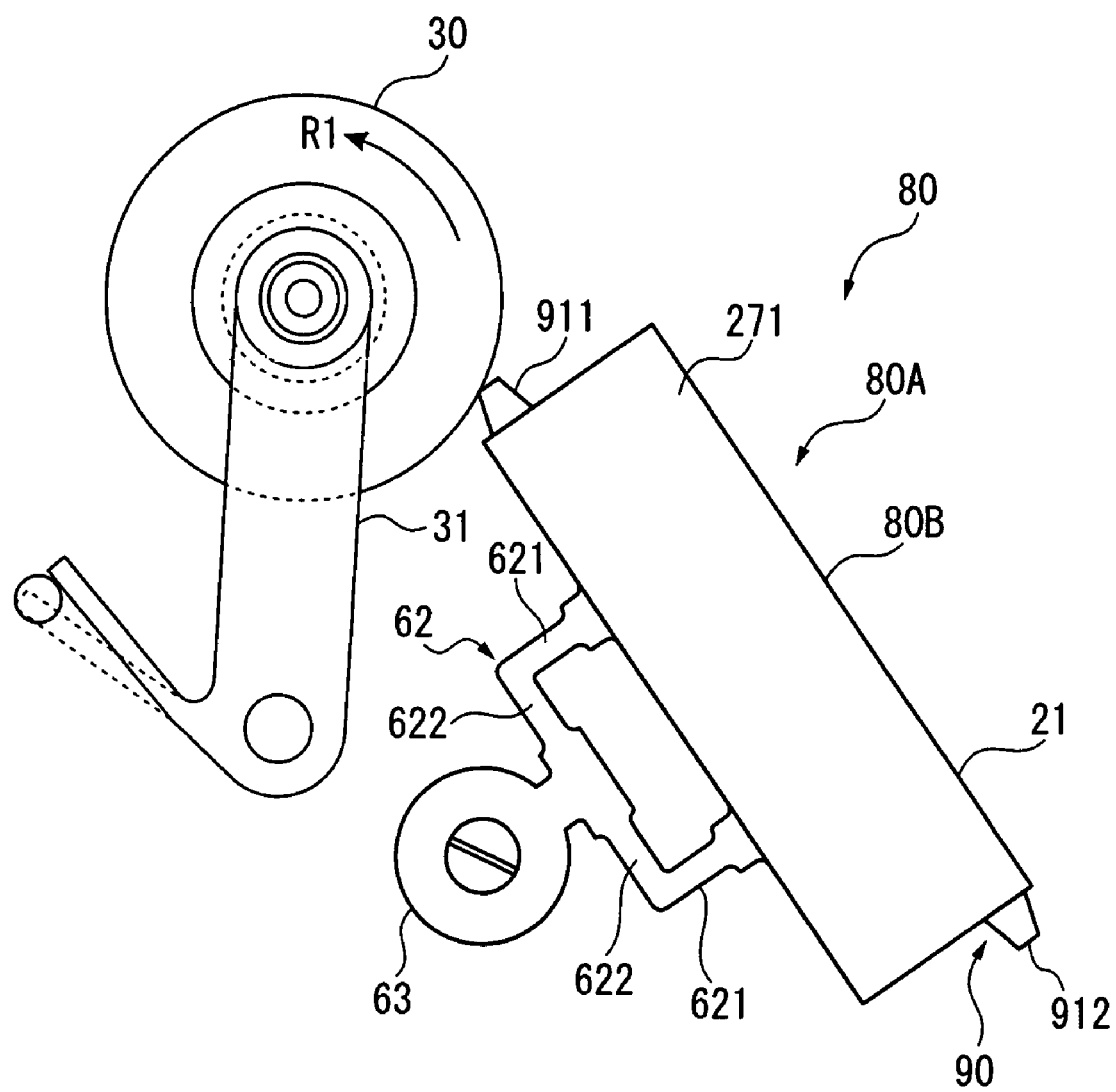
FIG. 9 is a plan view showing a piezoelectric actuator according to a modification of the invention.

FIG. 9 shows a piezoelectric actuator according to a modification of the invention. The piezoelectric actuator 80 rotates a rotor 30 in one direction (R1 direction), which includes a rectangular-plate piezoelectric vibrator 80A having a reinforcing plate 90 with the piezoelectric elements 21 and 22 with drive electrodes 271 provided on a surface thereof (see FIG. 4) being laminated on both sides. The location at which projections 911 and 912 are provided differs from that of the piezoelectric vibrator 20A (FIG. 3) of the exemplary embodiment and the projections 911 and 912 are diagonally provided on both ends of a vibrating member 80B in a point-symmetric manner with respect to the gravity center of the vibrating member 80B. Further, the support member 62 and the fixing portion 63 are provided only on one side of the vibrating member 80B. The fixing portion 63 is fixed on a base (not shown) by a screw. The rotor 30 is biased by the plate spring 31 toward the piezoelectric actuator 80 to bring the projection 911 into press-contact with a side of the rotor 30.

When voltage is applied on the drive electrode 271, the piezoelectric vibrator 80A excites a longitudinal vibration and bending vibration in a vibrating action similar to that shown in FIG. 6 on account of weight imbalance (in width direction) of the vibrating member 80B. At this time, the projection 912 that is not in contact with the rotor 30 works as a vibration balancer to stabilize the vibration. The projection 911 traces ellipsoidal vibration locus to rotate the rotor 30 in R1 direction. Incidentally, the anti-node of the bending vibration is located substantially at the same position as the anti-node Q shown in FIG. 5. Since the moment caused by the bending vibration is not applied on the support member 62, the intrinsic frequencies of the longitudinal vibration and bending vibration can be easily adjusted with the use of the first and the second support sections 621 and 622. Substantially the same advantages as the above-described exemplary embodiment can be obtained in the modification.

Incidentally, though triple-layered structure having a reinforcing plate with piezoelectric elements being respectively adhered on both sides is used in the above-described exemplary embodiment and modification, only one piezoelectric element may be attached on one side of the reinforcing plate or, alternatively, two to ten (or more) pieces of piezoelectric elements may be adhered on both sides of the reinforcing plate to provide a multi-layered structure, thereby increasing drive power of the vibrator.

Though substantially rectangular (planarly viewed) piezoelectric vibrator is used in the exemplary embodiment, the piezoelectric vibrator may be formed in trapezoid, diamond-shape, torus, parallelogram and the like. The drive electrode provided on the piezoelectric element may be divided in any manner. Further, the projection to be abutted on the object to be driven may not be provided and the free end of the vibrating member may be directly abutted on the object.

The shape of the support member can be freely designed as long as the first and the second support sections are provided. The first and the second rigid portions of the first and the second support sections may be provided without relying on expansion/contraction of the width of the support section. For instance, it is possible to differentiate the rigidity by providing tapered configuration on the first and the second support sections. Alternatively, the first and the second rigid portions may be provided by using different materials on the first and the second support sections. Further, adjustment of the intrinsic frequency using the first and the second support sections is possible without providing difference in the rigidity on the first and the second support sections (e.g. as in the first and the second rigid portions).

Though the pair of the first support sections are connected by the second support section to show a planar C-shaped support member, the support member may be formed in an L-shape where the first support section and the second support section are substantially perpendicularly arranged. The support member may not be formed on the reinforcing plate but may be formed in a stick-shape instead of a plate.

Further, the above-described rectangular-plate piezoelectric vibrators 20A and 80A is vibrated in a mixed mode of longitudinal vibration (expanding and contracting in in-plane direction of the plate surface) and bending vibration (bending and displacing relative to the stretching direction), and the first and the second support sections 621 and 622 formed on the support member 62 extend substantially perpendicularly in in-plane direction of the vibrating member 20B. However, extending direction of the first and the second support section may be defined in any manner, which is determined in accordance with the vibration mode of the piezoelectric vibrator. For instance, when the piezoelectric vibrator is deflection-vibrated relative to stretch plane of the longitudinal vibration, the second support section may be substantially perpendicularly raised from the stretch plane.

Though the piezoelectric actuator using the piezoelectric vibrator is installed in a wristwatch, the invention may be applied on a pocket watch, a stand clock, a wall clock and the like. The invention may also be applied on a mechanism for moving a wind-up doll and the like of the various types of watches as well as a mechanism for driving time and calendar display device.

The invention may be installed on various electronics other than electronic timepiece such as a camera, a printer, and movable toys. Specifically, the piezoelectric actuator of the invention may be used for zooming mechanism and auto-focusing mechanism, diaphragm adjusting mechanism and film advance system of a camera, paper-feeding mechanism and ink-jet head of a printer, drive mechanism and attitude correcting mechanism of movable toys and the like.

Further, the drive control device according to the invention may be used for a drive mechanism of meter pointer of a measuring instrument, a drive mechanism of meter pointer of an instrumental panel of an automobile, a piezoelectric buzzer, ultrasonic motor and the like. Alternatively, the piezoelectric vibrator of the invention may be employed not solely as a piezoelectric actuator but as an oscillator installed on an electronics circuit board.

The object to be driven may be a rotor that is rotated and a linear drive body that is linearly driven and the object may be driven in any direction.

Specific description of best mode for carrying out the invention has been provided in the above, however, the scope of the invention is not limited to the above description. In other words, though the invention has been illustrated and explained with reference to specific exemplary embodiment, various modifications and improvements to the above-described exemplary embodiment are possible by those skilled in the art with regard to shape, material, number and other details without deviating from technical idea and object of the invention.

The above descriptions regarding shape and material are only examples for enhancing understanding of the invention and are not for restricting the invention. The scope of the invention includes a component having references without a part of or entirety of the shape and material limitation.

What is claimed is:

1. A piezoelectric vibrator, comprising:
   a flat plate piezoelectric element, the piezoelectric vibrator vibrating in a mixed mode of stretching vibration that generates a displacement in a first direction within a plane of the piezoelectric element and a bending vibration that generates a displacement in a second direction orthogonal to the first direction;
   a vibrating member provided with the piezoelectric element and vibrated by applying voltage on the piezoelectric element;
   a support member provided on the vibrating member to support the vibrating member in a vibratable manner, the support member being provided on an outer edge of the vibrating member at a position adjacent to an anti-node that is not at a free end of the bending vibration, the support member including a first support section extending in a direction approximately orthogonal to the first direction and a second support section extending in a direction approximately orthogonal to the direction in which the first support section extends; and
   a fixing portion provided on the support member to be fixed on an object on which the piezoelectric vibrator is attached;
   wherein the first support section includes portions having different rigidity, the portions including a first rigid portion adjacent to the vibrating member and a second rigid portion having less rigidity than the first rigid portion.

2. The piezoelectric vibrator according to claim 1,
   wherein the first support section includes a pair of first support sections extending substantially in parallel from positions adjacent to different anti-nodes of a plurality of anti-nodes of the bending vibration, and
   the second support connects the pair of first support sections.

3. The piezoelectric vibrator according to claim 1,
   wherein the fixing portion is fixed on the object along a nodal line of the stretching vibration of the vibrating member.

4. The piezoelectric vibrator according to claim 1,
   wherein the second support section includes portions having different rigidity, the portions including a first rigid portion adjacent to the fixing portion and a second rigid portion having less rigidity than the first rigid portion.

5. The piezoelectric vibrator according to claim 1,
   wherein the vibrating member is formed by laminating a reinforcing plate on the piezoelectric element, and
   the first and the second support sections are integrally provided on the reinforcing plate.

6. A piezoelectric actuator, comprising:
   a piezoelectric vibrator that includes: a flat plate piezoelectric element, the piezoelectric vibrator vibrating in a mixed mode of stretching vibration that generates a displacement in a first direction within a plane of the piezoelectric element and a bending vibration that generates a displacement in a second direction orthogonal to the first direction; a vibrating member provided with the piezoelectric element and vibrated by applying voltage on the piezoelectric element, a free end of the stretching vibration of the vibrating member in the displacing direction abutting on a body to which the vibration of the piezoelectric vibrator is transmitted; a support member provided on the vibrating member to support the vibrating member in a vibratable manner, the support member being provided on an outer edge of the vibrating member at a position adjacent to an anti-node that is not at a free end of the bending vibration, the support member including a first support section extending in a direction approximately orthogonal to the first direction and a second support section extending in a direction approximately orthogonal to the direction in which the first support section extends; and a fixing portion provided on the support member to be fixed on an object on which the piezoelectric vibrator is attached; wherein the first support section includes portions having different rigidity, the portions including a first rigid portion adjacent to the vibrating member and a second rigid portion having less rigidity than the first rigid portion.

7. The piezoelectric actuator according to claim 6, wherein the support member includes a plurality of support members that are disposed substantially axisymmetrically with respect to a displacing direction of the stretching vibration of the vibrating member, and a vibration locus of the free end is switched substantially axisymmetrically with respect to the displacing direction of the stretching vibration of the vibrating member.

8. An electronic device, comprising:

a piezoelectric vibrator that includes a flat plate piezoelectric element, the piezoelectric vibrator vibrating in a mixed mode of stretching vibration that generates a displacement in a first direction within a plane of the piezoelectric element and a bending vibration that generates a displacement in a second direction orthogonal to the first direction; a vibrating member provided with the piezoelectric element and vibrated by applying voltage on the piezoelectric element; a support member provided on the vibrating member to support the vibrating member in a vibratable manner, the support member being provided on an outer edge of the vibrating member at a position adjacent to an anti-node that is not at a free end of the bending vibration, the support member including a first support section extending in a direction approximately orthogonal to the first direction and a second support section extending in a direction approximately orthogonal to the direction in which the first support section extends; and a fixing portion provided on the support member to be fixed on an object on which the piezoelectric vibrator is attached; wherein the first support section includes portions having different rigidity, the portions including a first rigid portion adjacent to the vibrating member and a second rigid portion having less rigidity than the first rigid portion.

9. The electronic device according to claim 8, wherein the electronic device is a timepiece including a timer and a time information display that displays information timed by the timer.

* * * * *

UNITED STATES PATENT AND TRADEMARK OFFICE
CERTIFICATE OF CORRECTION

| | | |
|---|---|---|
| PATENT NO. | : 7,586,237 B2 | Page 1 of 1 |
| APPLICATION NO. | : 11/705377 | |
| DATED | : January 26, 2010 | |
| INVENTOR(S) | : Yasuharu Hashimoto | |

It is certified that error appears in the above-identified patent and that said Letters Patent is hereby corrected as shown below:

Title Page,

Item [73], Assignee: "Seiko Corporation (JP)" should be --Seiko Epson Corporation, Tokyo (JP)--

Signed and Sealed this

Sixth Day of July, 2010

David J. Kappos
*Director of the United States Patent and Trademark Office*